United States Patent
Suda

(10) Patent No.: US 8,240,271 B2
(45) Date of Patent: Aug. 14, 2012

(54) SUBSTRATE PROCESSING APPARATUS

(75) Inventor: Atsuhiko Suda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1205 days.

(21) Appl. No.: 11/990,340

(22) PCT Filed: Nov. 1, 2006

(86) PCT No.: PCT/JP2006/321875
§ 371 (c)(1),
(2), (4) Date: Feb. 27, 2008

(87) PCT Pub. No.: WO2007/055138
PCT Pub. Date: May 18, 2007

(65) Prior Publication Data
US 2009/0120365 A1    May 14, 2009

(30) Foreign Application Priority Data
Nov. 10, 2005  (JP) .................................. 2005-325914

(51) Int. Cl.
*C23C 16/00* (2006.01)
(52) U.S. Cl. ....... 118/723 R; 118/723 ME; 118/723 ER; 118/723 IR

(58) Field of Classification Search .............. 118/723 R, 118/723 ME, 723 ER, 723 IR
See application file for complete search history.

(56) References Cited

U.S. PATENT DOCUMENTS
5,383,984 A * 1/1995 Shimada et al. .......... 156/345.26

FOREIGN PATENT DOCUMENTS
JP     A-2004-124234    4/2004
* cited by examiner

*Primary Examiner* — Keath Chen
(74) *Attorney, Agent, or Firm* — Oliff & Berridge

(57) ABSTRACT

To provide a substrate processing apparatus capable of easily installing a plasma discharge electrode having flexibility at a prescribed position in an electrode protective tube, and is capable of holing the plasma discharge electrode having flexibility at the prescribed position. This apparatus includes: a processing chamber that houses a plurality of substrates, with a space provided from each other in a state of being stacked; a gas supply unit that supplies a desired gas into the processing chamber; an exhaust unit that exhausts an atmosphere in the processing chamber; electrodes having flexibility that extend in a stacking direction of the substrates; a protective tube that contains each electrode; a first fitting member fixed to the tip end of each electrode; and a second fitting member disposed in a tip end part of each protective tube, the electrode being contained in the protective tube, with the first fitting member and the second fitting member connected to each other.

8 Claims, 10 Drawing Sheets

SUBSTRATE PROCESSING APPARATUS

TECHNICAL FIELD

The present invention relates to a substrate processing apparatus, and particularly relates to a vertical batch type plasma processing apparatus that performs reaction processing of a semiconductor substrate such as a silicon wafer by using plasma.

BACKGROUND ART

Conventionally, in this kind of the vertical batch type plasma processing apparatus, a plurality of semiconductor wafers are stored in a processing chamber in a state of being stacked with a space provided from each other, and a plasma discharge electrode is provided so as to extend in a stacking direction of the plurality of semiconductor wafers. An electrode protective tube is provided for protecting the plasma discharge electrode. The electrode protective tube has a structure of being curved on a lower side, so that the plasma discharge electrode can be installed in the electrode protective tube from a side face of the processing chamber. The plasma discharge electrode has a net-like structure so as to be inserted into a curved electrode protective tube.

DISCLOSURE OF THE INVENTION

Problem to be Solved by the Invention

The plasma discharge electrode of the net-like structure installed in the electrode protective tube is sometimes shorter than an initial length by a deterioration of elasticity due to an influence of heat and long term use or by its own weight. Therefore, a change occurs in a generated plasma region, thus causing a non-uniformity of a plasma distribution between semiconductor wafers and a non-uniformity of a film thickness obtained by reaction processing in some cases.

In addition, even when the plasma discharge electrode is loaded into the electrode protective tube, trouble is sometimes caused in installing the plasma discharge electrode at a prescribed position.

A main object of the present invention is to provide a substrate processing apparatus capable of easily installing the plasma discharge electrode having flexibility at a prescribed position in the electrode protective tube, and capable of holding the plasma discharge electrode having flexibility at a prescribed position even during use.

Means to Solve the Problem

According to a first aspect of the present invention, there is provided a substrate processing apparatus including a processing chamber that houses a plurality of substrates, with a space provided from each other, in a state of being stacked; a gas supply unit that supplies a desired gas into the processing chamber; an exhaust unit that exhausts an atmosphere in the processing chamber; at least two electrodes disposed to extend in a stacking direction of the substrates and having flexibility; a protective tube that contains each electrode; a first fitting member fixed to a tip end of each electrode; and a second fitting member disposed at a tip end part of each protective tube, the aforementioned electrode being contained in the protective tube, with the first fitting member and the second fitting member connected to each other.

According to other aspect of the present invention, there is provided the substrate processing apparatus including the processing chamber that houses a plurality of substrates with a space provided from each other in a state of being stacked; a gas supply unit that supplies a desired gas into the processing chamber; an exhaust unit that exhausts the atmosphere in the processing chamber; at least two electrodes having flexibility that extends in the stacking direction of the substrates and having a net-like electrode and a core assembled into the net-like electrode; the protective tube disposed in the reaction tube that forms the processing chamber, with the tip end part closed and the other end part opened, for containing each electrode; the first fitting member fixed to the tip end of each electrode; and the second fitting member disposed in the tip end part of each protective tube and disposed at a further upper position from the uppermost substrate of the plurality of substrates housed in the processing chamber, the aforementioned electrode being inserted into the protective tube from the other end part of the protective tube toward the tip end part of the protective tube, with the first fitting member set as a head, and the electrode is contained in the protective tube in a state that the first fitting member and the second fitting member are connected with each other.

Advantage of the Invention

According to the present invention, there is provided the substrate processing apparatus capable of easily installing the plasma discharge electrode having flexibility at a prescribed position in the electrode protective tube, and capable of holding the plasma discharge electrode having flexibility at a prescribed position even during use.

BEST MODE FOR CARRYING OUT THE INVENTION

Next, preferred embodiments of the present invention will be explained.

FIG. 1 is an outline lateral sectional view of a vertical type substrate processing furnace in a substrate processing apparatus according to an example of the present invention, and FIG. 2 is an outline vertical sectional view taken along the line AA of FIG. 1, and FIG. 3 is an outline vertical sectional view taken along the Line BB of FIG. 1. FIG. 4 is an outline view for explaining a structure of a plasma discharge electrode in the vertical type substrate processing furnace of the substrate processing apparatus according to an example of the present invention, and FIG. 5 is an outline view for explaining a fitting structure of the plasma discharge electrode in the vertical type substrate processing furnace of the substrate processing apparatus according to an example of the present invention, and FIG. 7 is an outline sectional view showing a positional relation between the electrode protective tube and the plasma discharge electrode in the vertical type substrate processing furnace of the substrate processing apparatus according to an example of the present invention. In addition, FIG. 8 to FIG. 10 are outline view for explaining each fitting structure of the plasma discharge electrode in the vertical type substrate processing furnace of the substrate processing apparatus according to other example of the present invention.

According to FIGS. 1 to 3, a reaction tube 203 made of quartz for processing a wafer 200 is disposed inside of a heater 207, and the reaction tube 203 is installed on a lower side reaction tube 209. A lower end opening of the lower side reaction tube 209 is air-tightly closed by a seal cap 219, being a lid member, via an O-ring (not shown), being a sealing member. A processing furnace 202 is formed by at least the heater 207, the reaction tube 203, the lower side reaction tube 209, and the seal cap 219. In addition, the processing chamber 201 is formed by at least the reaction tube 203, the lower side reaction tube 209, and the seal cap 219.

A boat 217 is erected on the seal cap 219. The boat 217 is inserted into the processing chamber 201. A plurality of wafers 200 subjected to batch processing are stored in the boat in a state of being vertically stacked at equal intervals in multiple stages in a horizontal posture. The boat 217 can enter into the reaction tube 203 by a boat elevator 115 (see FIG. 6). In addition, in order to secure uniformity of processing, a rotation mechanism (not shown) for rotating the boat 217 as needed is provided. The heater 207 heats the wafer 200 inserted into the reaction tube 203 at a prescribed temperature.

The lower side reaction tube 209 includes a gas supply tube 232 that supplies a desired gas into the processing chamber and a gas exhaust tube 232 that exhausts an atmosphere in the processing chamber 201.

A buffer chamber 237, being a gas dispersion space, is disposed along a stacking direction of the wafers 200 in an arcuate space between an inner wall of the reaction tube 203 and each wafer 200.

In the buffer chamber 237 for generating plasma, long and narrow two plasma discharge electrodes 270 are disposed side by side as plasma generating sources, covered with a dielectric electrode protective tube 276, so that high frequency power generated from an oscillator 283 is applied to each electrode end part of the two plasma discharge electrodes 270 via a matching unit 282.

As shown by a broken line part of FIG. 7, the electrode protective tube 276 covering each of the two plasma discharge electrodes 270 is set in a state that upper parts thereof (namely, the tip end parts) are mutually connected. In addition, lower parts (namely, the other end parts) of the electrode protective tube 276 are respectively set in an open state An inside of the electrode protective tube 276 can be purged by inert gas such as nitrogen ($N_2$).

The lower side of the electrode protective tube 276 is formed in a curved shape, so that the plasma discharge electrodes 270 can be installed in the electrode protective tube 276 from the side face of the processing chamber 201. The lower part of the electrode protective tube 276 is curved, penetrates through the side face of the lower side reaction tube 209, and projects to the outside. The electrode protective tube 276 is provided so as to extend from the lower side of the wafer 200 to the upper side of the wafer 200, along the stacking direction of the wafer 200.

The plasma discharge electrode 270 is inserted into the electrode protective tube 276 from the lower side. The plasma discharge electrode 270 is disposed so as to extend from the lower side of the wafer 200 to the upper side of the wafer 200 along the stacking direction of the wafer 200. The plasma discharge electrode 270 has a net-like structure that can be curved, so as to be inserted into a curved electrode protective tube 276. An Ni group alloy is used as a material of the plasma discharge electrode 270, in consideration of a resistance to heat.

The electrode end part 278 of the plasma discharge electrode 270 is penetrated through the lower side reaction tube 209 and is pulled out to the outside. However, the inside of the electrode protective tube 276 is formed in a space independent of the inside of the reaction tube 203, and is always set in an atmospheric pressure.

On the side wall of the buffer chamber 237 for generating plasma, installed on the wall face of the inside of the reaction tube 203, a plurality of small holes 248 for jetting gas toward the inside of the reaction tube 203 are provided along the stacking direction of the wafer 200.

The high frequency power is applied between the two plasma discharge electrodes 270 which are disposed side by side, and plasma 224 is thereby generated. Active species generated by plasma 224 are passed through the small holes 248 together with other gas particles and supplied to the wafer 200.

At this time, in order to suppress a jetting amount of charged particles generated by plasma 224 from the small holes 248, the structure of the buffer chamber 237 and the number and positions of the small holes 248 are optimized according to the purpose of processing. In this example, the small holes 248 are disposed so as to be positioned in a middle of the wafer 200.

The buffer chamber 237 for generating plasma is disposed on the wall face of the inside of the reaction tube 1, and plasma generation space is limited in the buffer chamber 237, thus making it possible to suppress a diffusion of the charged particles and reduce a damage caused by ions added to the wafer 200.

Next, explanation will be given to the structure of the plasma discharge electrode 270 of this example and a method of attaching this plasma discharge electrode 270, with reference to FIG. 4 and FIG. 5.

According to FIG. 4, the plasma discharge electrode 270 is an electrode, with a core 272 incorporated into a net-like electrode 271. The core 272 is formed of the same material as that of the net-like electrode 271. When the plasma discharge electrode 270 is packaged in the electrode protective tube 276, the core 272 having rigidity allowing it to be properly bended and having sufficient thickness is selected. By adopting the net-like electrode 271, bending of the plasma discharge electrode 270 becomes possible. By incorporating the core 272 inside, expansion and shrinkage of the plasma discharge electrode 270 can be prevented and a length can be made constant.

As shown in FIG. 5, the tip end of the core 272 is welded on the net-like electrode 271. A banana-shaped spring terminal 273 as a first fitting member is respectively bonded to the tip end of the core 272. The banana-shaped spring terminal 273 has a banana-shaped spring as an elastic part, with expansion and shrinkage of its thickness freely allowed to occur.

A second fitting member 274 constituted of quartz, for example, is fitted to the tip end part of the inside of the electrode protective tube 276. A hole 275, being a fixing part, is formed in the second fitting member 274 so as to penetrate the second fitting member 274. Note that the second fitting member 274 is fitted to a position of the inside of the electrode protective tube 276 and further upper side of an uppermost wafer 200 of a plurality of wafers 200 stored in the processing chamber 201.

The plasma discharge electrode 270 is inserted into the electrode protective tube 276, from the other end part of the electrode protective tube 276 (namely, a lower side of the electrode protective tube 276) toward the tip end part of the electrode protective tube 276 (namely, an upper side of the electrode protective tube 276), with a banana-shaped spring terminal 273, being the first fitting member, set as a head. Namely, the plasma discharge electrode 270 is contained in the electrode protective tube 276, with the banana-shaped spring terminal 273 inserted into the hole 275. When the banana-shaped spring terminal 273 is pushed into the hole 275 from the lower side, shrinkage in thickness of the banana-shaped spring terminal 273 occurs, to allow the banana-shaped spring terminal 273 to penetrate the hole 275. Then, expansion of the thickness of the banana-shaped spring terminal 273 that penetrates the hole 275 occurs (namely, shrinkage of the spring recovers), thus making it possible to connect the first fitting member and the second fitting member.

The plasma discharge electrode 270 is semi-permanently fixed by the banana-shaped spring terminal 273 and the hole 275, and a time change such as a shrinkage of the plasma discharge electrode 270 after packaging the plasma discharge electrode 270 into the electrode protective tube 276 is significantly restrained, thus making it possible to secure a stable plasma generating region and secure a uniformity of processing such as a uniformity in a stable film thickness of the wafer, over a long time period.

By inserting the banana-shaped spring terminal into the hole 275, the plasma discharge electrode 270 is packaged into the electrode protective tube 276, thus realizing an easy packaging. In addition, even if the necessity for replacing the plasma discharge electrode 270 is generated, it can be easily detached, because the banana-shaped spring terminal 273 is used, thus realizing an excellent maintenance property.

Note that structures of the first fitting member and the second fitting member are not necessarily limited to the aforementioned structure. Other structures of the first fitting member and the second fitting member will be explained with reference to FIG. 8 to FIG. 10.

(Structure Using a Bending Spring Structure)

As other structure, as shown in FIG. 8, the first fitting member may be constituted as a plate-like spring bended as an elastic member or a bending spring terminal 273a having a bended stick-like spring.

In this case, when the bending spring terminal 273a is pushed into the hole 275 from the lower side, the bending spring terminal 273a penetrates the hole 275 by the shrinkage of a width of the bending spring terminal 273a. Then, by the expansion of the width of the bending spring terminal 273a that penetrates the hole 275 (namely by recovery of the shrinked spring), the first fitting member and the second fitting member can be connected to each other.

In addition, when the plasma discharge electrode 270 is pulled from the lower side, similarly to a case of connection, expansion and shrinkage of the width of the bending spring terminal 273a occurs in a diameter direction of the hole 275, and the connection of the first fitting member and the second fitting member is opened.

Note that according to the above description, a through hole 275b may be formed on the tip end part of the first fitting member, and a banana-shaped spring terminal 273 or the bending spring terminal 273a may be formed in the second fitting member.

(Structure Using a Bayonet Structure)

As other structure, as shown in FIG. 9, the first fitting member may be constituted as a block member 273b including a neck part 273c and a head part 273d having a diameter thicker than that of the neck part 273c. Here, the head part 273d is constituted as a rectangular solid block made of Ni, etc, for example. In addition, the second fitting member includes an upper side projection diagram of the head part 273d, and has a hole 275d through which the solid block can be penetrated. Note that the shape of the head part 273 is not necessarily limited to the rectangular solid, and it may be a triangular prism or an ellipsoidal plate, etc.

In this case, after the head part 273d of the block member 273b is pushed into the through hole 275b from the lower side, by axially rotating the plasma discharge electrode 270, thereby hitching the head part 273d to the through hole 275b, the first fitting member and the second fitting member can be connected to each other. In addition, when the plasma discharge electrode 270 is detached, by axially-rotating the plasma discharge electrode 270, while hitching the plasma discharge electrode 270 from the lower side, the connection of the first fitting member and the second fitting member can be opened.

In addition, in the aforementioned description, the hole 275b may be formed on the tip end part of the first fitting member and a block member 273b may be formed in the second fitting member.

(Structure Using a Screw Structure)

As other structure, as shown in FIG. 10, a convex screw member 273e may be formed as the first fitting member, and a screw hole 275e corresponding to the convex screw may be formed in the second fitting member.

In this case, by inserting and fastening the convex screw member 273e into the screw hole 275e from the lower side while axially rotating the plasma discharge electrode 270, the first fitting member and the second fitting member can be connected to each other. In addition, when the plasma discharge electrode 270 is detached, the connection of the first fitting member and the second fitting member is opened.

In addition, in the aforementioned description, the screw hole 275e may be formed in the first fitting member and the convex screw member 273e may be formed in the second fitting member.

Also, it is a matter of course that a space 274a is formed outside or inside of the fitting member 274 or in the convex screw member 273e, so that the inside of the electrode protective tube 276 as described above can be purged by inert gas. FIG. 11 is an outline view showing the structure of the space 274a for purging the inside of the electrode protective tube 276 by inert gas, (a) is a general outline view showing the space 274a provided outside of the fitting member 274, (b) is a general outline view showing the space 274a disposed inside of the fitting member 274, and (c) is a general outline view showing the space 274a disposed in the convex screw member 273e.

Next, an operation of performing reaction processing will be explained.

The boat 217 is lowered by a boat elevator 115 (see FIG. 9), and after the wafer 200 is placed on the boat 217, the boat 217 is elevated, which is then inserted into the reaction tube 203.

Power is applied to the heater 207, to heat to a prescribed temperature the temperature of the reaction tube 203, the boat 217 and the wafer 200 inside of the reaction tube 203, and simultaneously, the inside of the reaction tube 203 is exhausted by a pump not shown connected to a gas exhaust tube 231.

After the temperature of each part of the inside of the reaction tube 203 is set at a prescribed value, the gas used in processing of the wafer 200 is introduced to the buffer chamber 237 by the gas supply tube 232 while rotating the boat 217.

The pressure inside of the reaction tube 203 is adjusted by a pressure adjustment mechanism not shown connected to the gas exhaust tube 231, and after the pressure shows a prescribed value, the high frequency power outputted from the oscillator 283 is supplied to the electrode end part 278 via the matching unit 282.

Thus, plasma 224 is generated in the buffer chamber 237, and introduced gas or activated particles are supplied to the rotating wafer 200 from a plurality of small holes 248 formed on the side wall of the buffer 237, and the reaction processing is performed under a reduced pressure. The gas used in the reaction processing is exhausted from the gas exhaust tube 231.

As described above, according to this example, a vertical batch type plasma processing apparatus is provided, capable of easily packaging the plasma discharge electrode 270 and capable of restraining the time change such as a shrinkage of the plasma discharge electrode 270 after packaging as much as possible, capable of securing a stable plasma generating region over a long period of time, and capable of securing a stable uniform plasma processing such as a uniformity in film thickness of the wafer 200, being the substrate to be processed.

Next, explanation will be given to a preferred example of the present invention, with reference to FIG. 6. According to the preferred example of the present invention, the substrate processing apparatus is constituted, for example, as a semiconductor manufacturing device for executing a processing step in the manufacturing method of the semiconductor device. FIG. 5 is an outline perspective view for explaining the substrate processing apparatus of this example.

A casing 111 is formed in a processing apparatus 101 of the present invention using a cassette 110 as a wafer carrier in which the wafer (substrate) 200 composed of silicon, etc, is stored. A front maintenance port (not shown) is opened in the lower part of a front face wall (not shown) of the casing 111 so that the maintenance can be performed, and a front maintenance door (not shown) for opening/closing this front maintenance port (not shown) is built. A cassette loading/unloading port (substrate container loading/unloading port) (not shown) is opened so as to communicate the inside and the outside of the casings 111, and the cassette loading/unloading port (not shown) is opened/closed by a front shutter (substrate container loading/unloading opening and closing mechanism) (not shown).

A cassette stage (substrate container transfer table) 114 is set inside of the casing 111 of the cassette loading/unloading port (not shown). The cassette 110 is loaded onto the cassette stage 114 and is unloaded from the cassette stage 114, by an in-step transfer device (not shown).

The cassette stage 114 is placed by the in-step transfer device, so that the wafer 200 in the cassette 110 is set in a vertical posture and a wafer charging/discharging port of the cassette 110 is directed upward. The cassette stage 114 can be operated so that the cassette 110 is rotated by 90° in a clockwise vertical direction to a rear side of the casing, and the wafer 200 in the cassette 110 is set in a horizontal posture and the wafer charging/discharging port of the cassette 110 is directed to the rear side of the casing.

A cassette shelf (substrate container placement shelf) 105 is set in the casing 111, in an approximately central part in a longitudinal direction, so that a plurality of cassettes 110 are stored on the cassette shelf 105 in multiple stages and multiple rows. A transfer shelf 123, on which each cassette 110, being a transfer object of a wafer transfer mechanism 125 is stored, is disposed on the cassette shelf 105.

In addition, a preliminary cassette shelf 107 is disposed above the cassette stage 114, so that the cassette 110 is preliminarily stored thereon.

A cassette carrier (substrate container transport unit) 118 is set between the cassette stage 114 and the cassette shelf 105. The cassette carrier 118 is constituted of a cassette elevator (substrate container elevation mechanism) 118a capable of being elevated in a state of holding the cassette 110, and a cassette carrier mechanism (substrate container transport mechanism) 118b as a transport mechanism, so that the cassette 110 is carried to the cassette stage 114, the cassette shelf 105, the preliminary cassette shelf 107, by a continuous operation of the cassette elevator 118a and the cassette transport mechanism 118b.

The wafer transport mechanism (substrate transport mechanism) 125 is set behind the cassette shelf 105, and the wafer transfer mechanism 125 is constituted of a wafer transfer device (substrate transfer device) 125a capable of horizontally rotating and straightly moving the wafer 200, and a wafer transfer device elevator (substrate transfer device elevation mechanism) 125b for elevating the wafer transfer device 125a. The wafer transfer device elevator 125b is set at a right end part of the casing 111 of withstand pressure. By the continuous operation of these wafer transfer device elevator 125b and wafer transfer device 125a, the wafer 200 is charged and discharged into/from a boat (substrate holding tool) 217, with a tweezer (substrate holding member) 125c of the wafer transfer device 125a set as a placement part of the wafer 200.

A processing furnace 202 is disposed in a rear upper side of the casing 111. The lower end part of the processing furnace 202 is formed so as to be opened/closed by a furnace throat shutter (furnace throat opening/closing mechanism) 147.

A boat elevator (substrate holding tool elevation mechanism) 115 as an elevation mechanism is disposed below the processing furnace 202, so that the boat 217 is elevated to the processing furnace 202, and a seal cap 219 as a lid member is horizontally installed on an arm 128 as a connecting tool connected to an elevation table of the boat elevator 115, so that the seal cap 219 vertically supports the boat 217 and can close the lower end part of the processing furnace 202.

The boat 217 has a plurality of holding members, so that a plurality of (for example 50 to 150) wafers 200 can be respectively held horizontally in a state of being arranged, with their centers aligned.

A clean unit 134a constituted of a supply fan and a dust proof filter is disposed above the cassette shelf 105 for supplying clean air, being cleaned atmosphere, so that the clean air is flown into the casing 111.

In addition, a clean unit 134b constituted of the supply fan and the dust-free filter for supplying clean air is installed at a left end part of the casing 111, on the opposite side to the side of the wafer transfer device elevator 125b and the boat elevator 115, so that the clean air blown from the clean unit 134b is flown to the wafer transfer device 125a and the boat 217, thereafter is sucked into an exhaust device not shown, and is exhausted to the outside of the casing 111.

Next, the operation of the substrate processing apparatus of this example will be explained.

Before the cassette 110 is supplied to the cassette stage 114, the cassette loading/unloading port (not shown) is opened by a front shutter (not shown). Thereafter, the cassette 110 is loaded from the cassette loading/unloading port (not shown), and is placed on the cassette stage 114, so that the wafer 200 is set in a vertical posture and the wafer charging/discharging port of the cassette 110 is directed upward. Thereafter, by the cassette stage 114, the cassette 110 is rotated by 90° clockwise in a vertical direction to the rear side of the casing, so that the wafer 200 in the cassette 110 is set in a horizontal posture and the wafer charging/discharging port of the cassette 110 is directed to the rear side of the casing.

Next, the cassette 110 is automatically carried and transferred by the cassette carrier 118 to a designated shelf position of the cassette shelf 105 or the preliminary cassette shelf 107, temporarily stored therein, and thereafter transferred to a transfer shelf 123 from the cassette shelf 105 or the preliminary cassette shelf 107 by the cassette carrier 118, or directly carried to the transfer shelf 123.

When the cassette 110 is transferred to the transfer shelf 123, the wafer 200 is picked up through the wafer charging/discharging port by the tweezer 125c of the wafer transfer device 125a from the cassette 110, and is charged into the boat 217 which is disposed behind the transfer chamber. The wafer transfer device 125a that transfers the wafer 200 to the boat 217 returns to the cassette 110 and charges the next wafer 110 into the boat 217.

When previously designated numbers of wafers 200 are charged into the boat 217, the lower end part of the processing furnace 202 closed by the furnace throat shutter 147 is opened by the furnace throat shutter 147. Subsequently, the boat 217 holding a wafer 200 group is elevated by the boat elevator 115 and is loaded into the processing furnace 202.

After being loaded, processing is applied to the wafer 200 in the processing furnace 202. After processing, the wafer 200 and the cassette 110 are discharged to the outside of the casing 111, by a reversed procedure to the aforementioned procedure.

Preferred Embodiments of the Present Invention

A first aspect of the present invention provides a substrate processing apparatus, including:
a processing chamber that houses a plurality of substrates, with a space provided from each other, in a state of being stacked;
a gas supply unit that supplies a desired gas into the processing chamber;
an exhaust unit that exhausts an atmosphere in the processing chamber;
at least two electrodes disposed so as to extend in a stacking direction of the substrates and having flexibility;
a protective tube that contains each electrode;
a first fitting member fixed to the tip end of each electrode; and
a second fitting member disposed in a tip end part of each protective tube,
the electrode being contained in the protective tube, with the first fitting member and the second fitting member connected to each other.

A second aspect of the present invention provides the substrate processing apparatus according to the first aspect, wherein the electrode has a net-like electrode and a core incorporated into the net-like electrode.

A third aspect of the present invention provides the substrate processing apparatus according to the first aspect, wherein the protective tube is disposed inside of a reaction tube that forms the processing chamber.

A fourth aspect of the present invention provides the substrate processing apparatus according to the first aspect, wherein the protective tube having the second fitting member has the tip end part closed and the other end part opened, and the electrode is inserted into the protective tube from the other end part of the protective tube toward the tip end part of the protective tube, with the first fitting member set as a head.

A fifth aspect of the present invention provides the substrate processing apparatus according to the fourth aspect, wherein the second fitting member disposed in the tip end part of the protective tube is disposed at a further upper position from an uppermost substrate of the plurality of substrates contained in the processing chamber.

A sixth aspect of the present invention provides the substrate processing apparatus according to the first aspect, wherein the second fitting member has a through hole and the first fitting member has an elastic part that penetrates the through hole, and a width of the elastic part is expanded in a diameter direction of the through hole after penetrating the through hole, and the first fitting member and the second fitting member are connected to each other.

A seventh aspect of the present invention provides the substrate processing apparatus according to the sixth aspect, wherein the elastic part of the first fitting member is a spring terminal.

An eighth aspect of the present invention provides a processing chamber, including:
a processing chamber that houses a plurality of substrates, with a space provided from each other in a state of being stacked;
a gas supply unit that supplies a desired gas into the processing chamber;
an exhaust unit that exhausts an atmosphere in the processing chamber;
at least two electrodes disposed to extend in a stacking direction of the substrates, having a net-like electrode and a core incorporated into said net-like electrode and having flexibility;
a protective tube disposed inside of a reaction tube that forms the processing chamber, with a tip end part closed and the other end part opened, for containing each electrode;
a first fitting member fixed to the tip end of each electrode;
a second fitting member disposed in the tip end part of each protective tube and disposed at a further upper position from an uppermost substrate of the plurality of substrates housed in the processing chamber,
the electrode being inserted into the protective tube from the other end part of the protective tube toward the tip end part of the protective tube, with the first fitting member set as a head, and
the electrode being contained in the protective tube, with the first fitting member and the second fitting member connected to each other.

DESCRIPTION OF SIGNS AND NUMERALS

Figure 1:
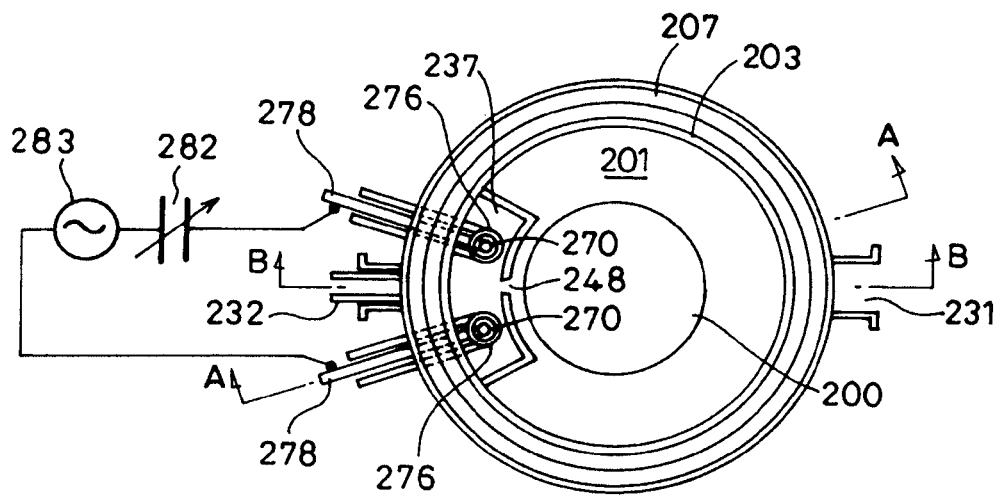
FIG. 1 is an outline lateral sectional view of a vertical type substrate processing furnace in a substrate processing apparatus according to an example of the present invention.
Figure 2:
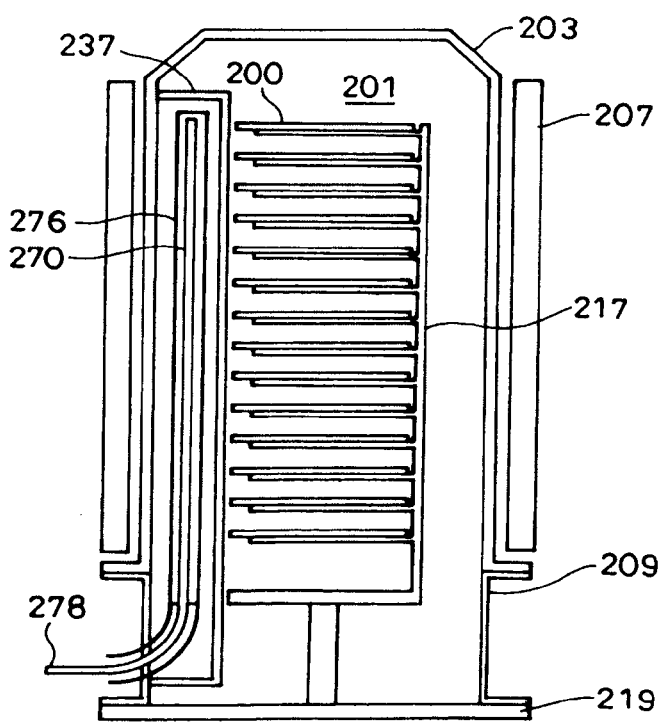
FIG. 2 is an outline vertical sectional view taken along the line AA of FIG. 1.
Figure 3:
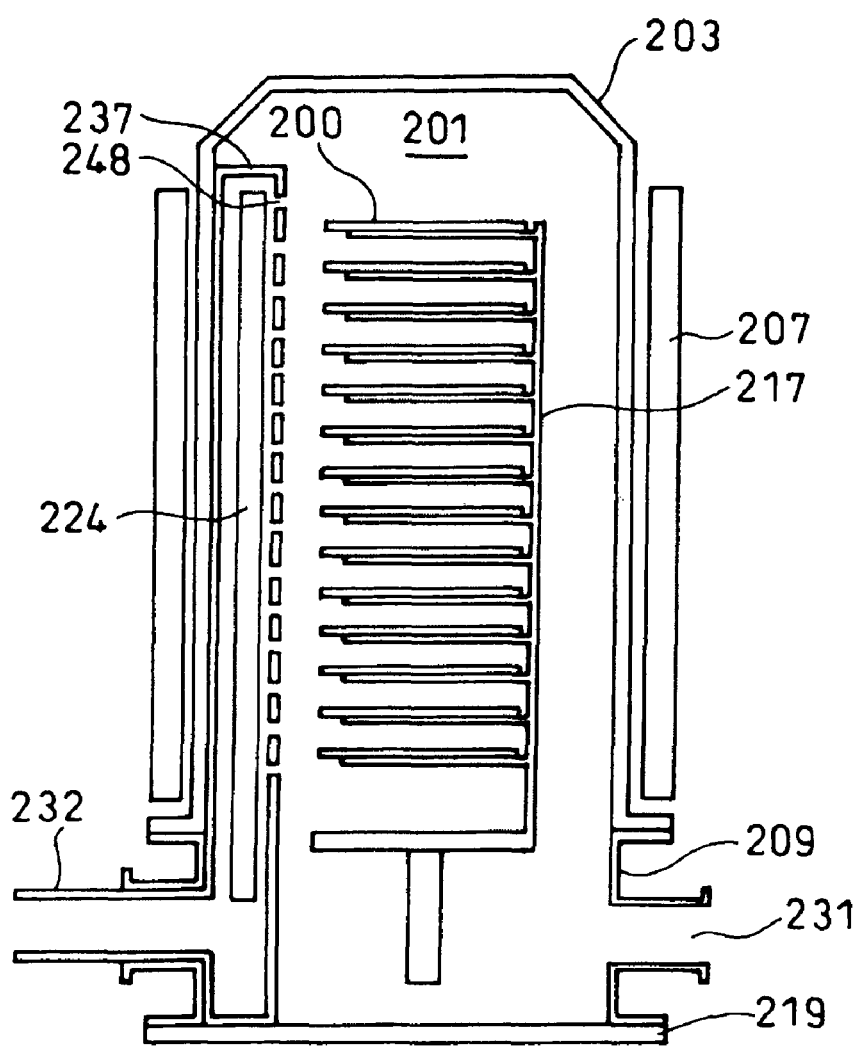
FIG. 3 is an outline vertical sectional view taken along the line BB of FIG. 1.
Figure 4:
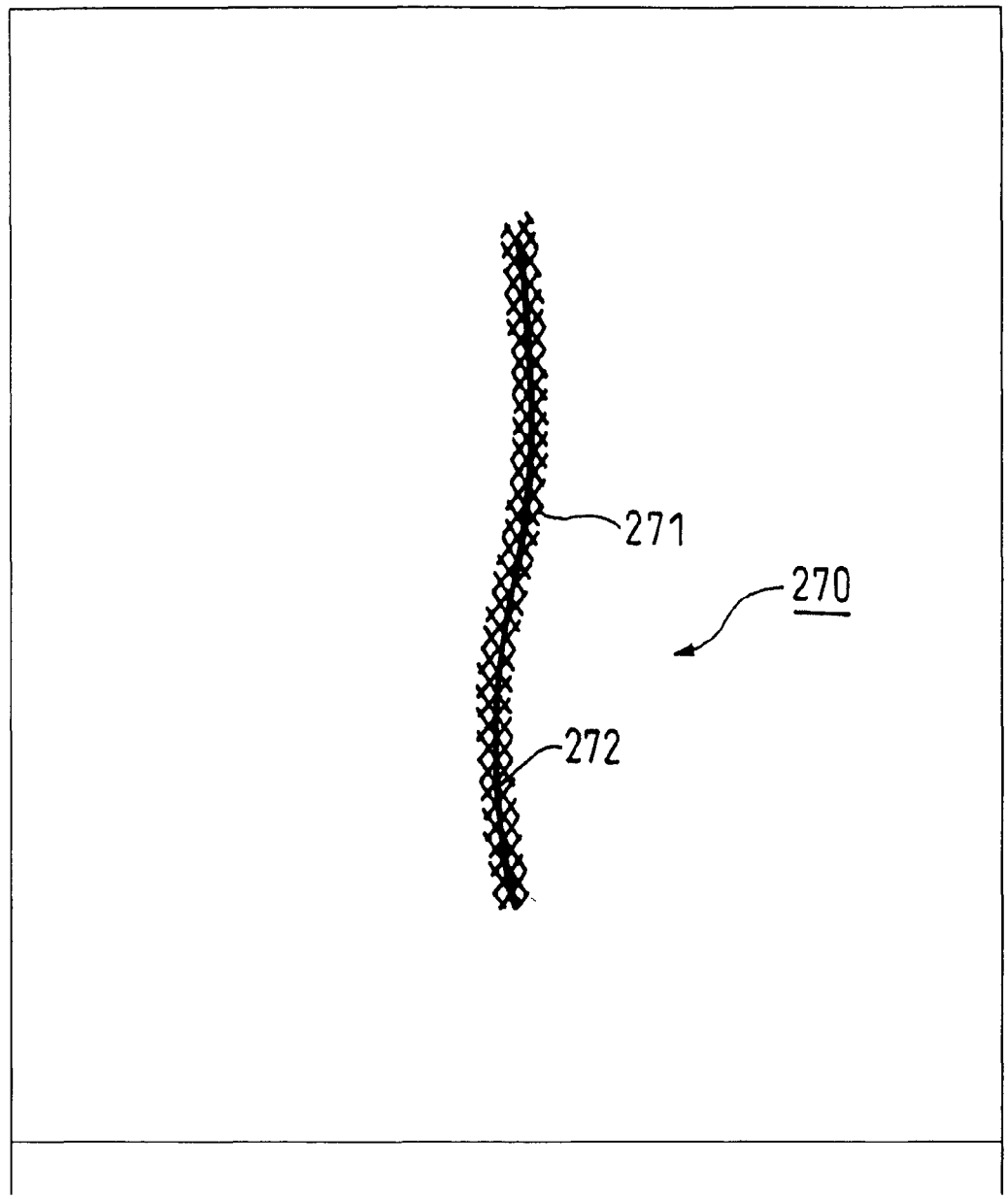
FIG. 4 is an outline view for explaining a structure of a plasma discharge electrode in a vertical type substrate processing furnace of the substrate processing apparatus according to an example of the present invention.
Figure 5:
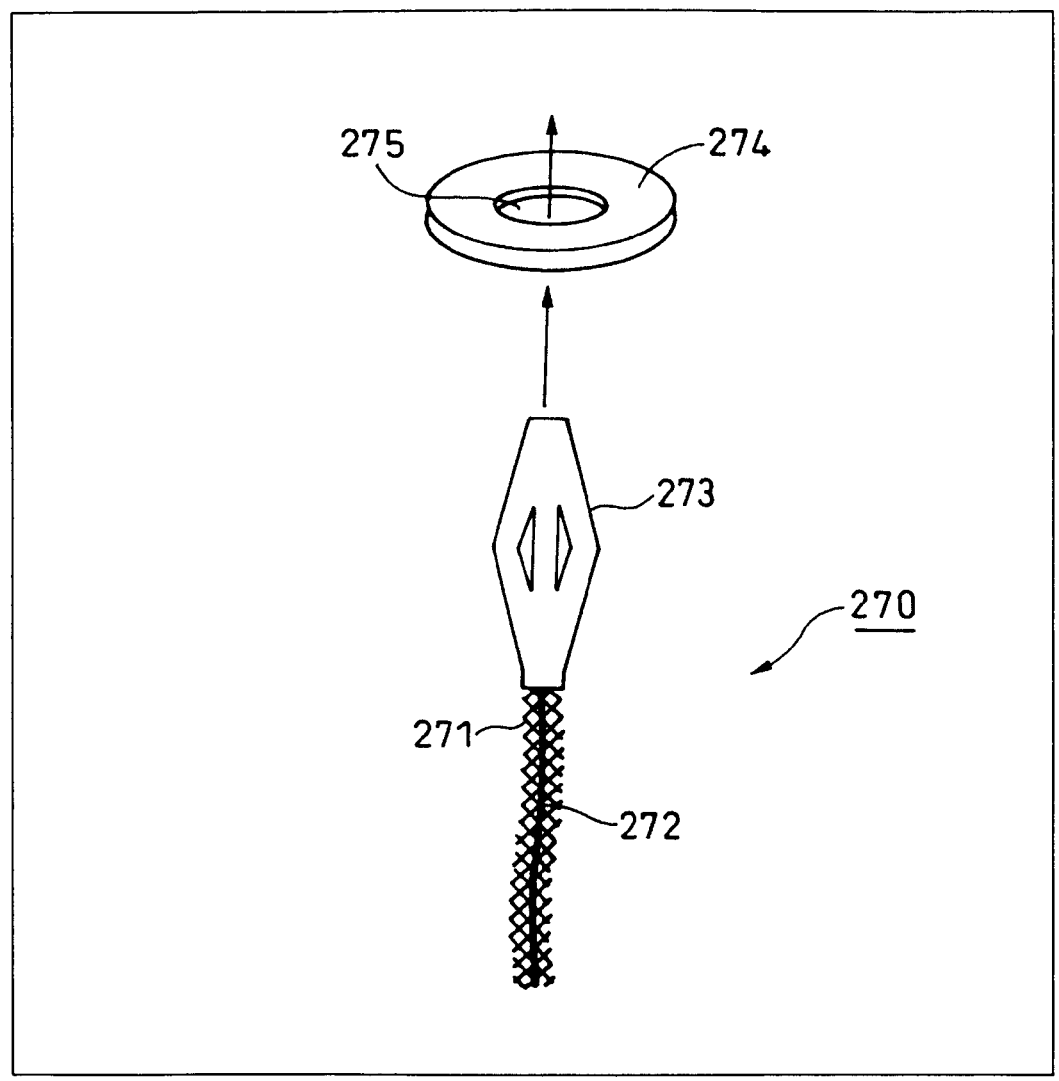
FIG. 5 is an outline view for explaining a fitting structure of the plasma discharge electrode in the vertical type substrate processing furnace of the substrate processing apparatus according to an example of the present invention.
Figure 6:
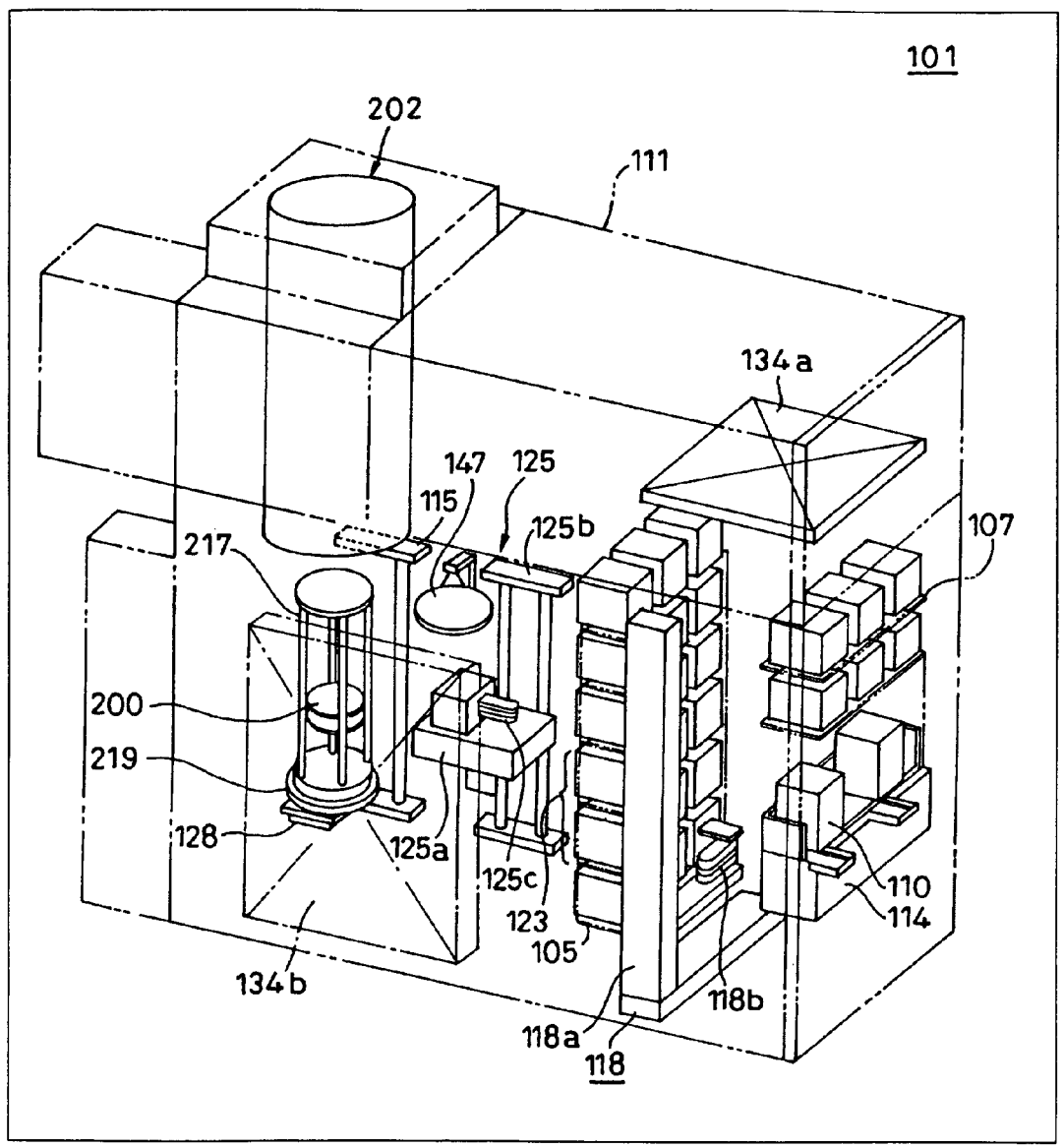
FIG. 6 is an outline perspective view for explaining the substrate processing apparatus according to an example of the present invention.
Figure 7:
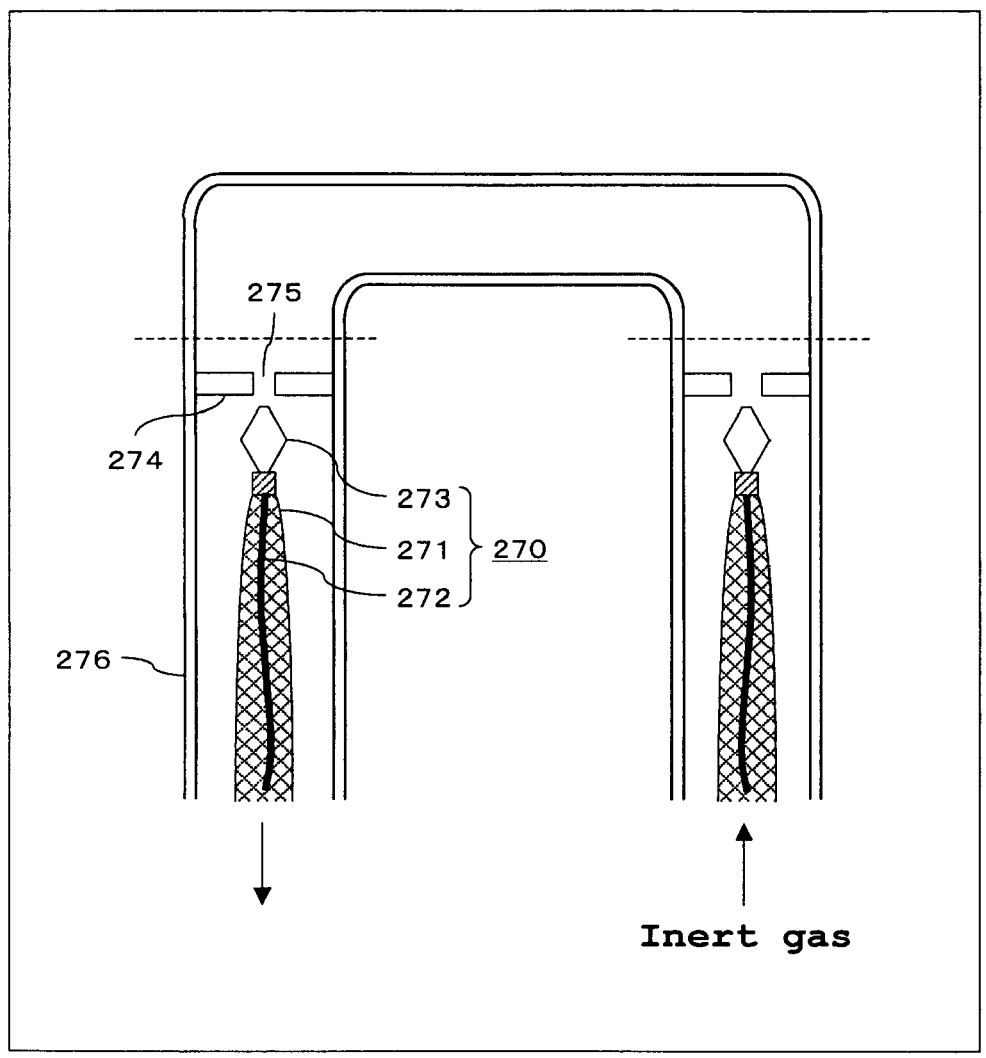
FIG. 7 is an outline sectional view showing a positional relation between an electrode protective tube and a plasma discharge electrode in the vertical type substrate processing furnace of the substrate processing apparatus according to an example of the present invention.
Figure 8:
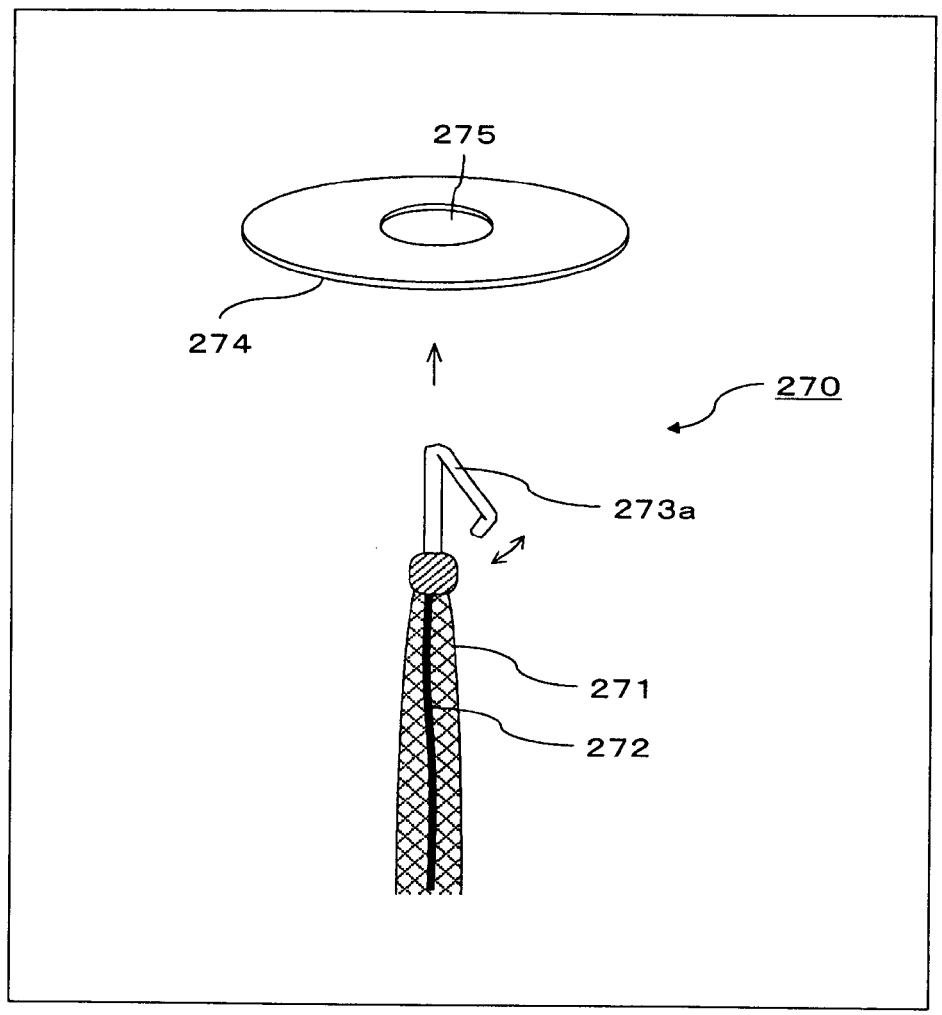
FIG. 8 is an outline view for explaining the fitting structure of the plasma discharge electrode in the vertical type substrate processing furnace of the substrate processing apparatus according to other example of the present invention.
Figure 9:
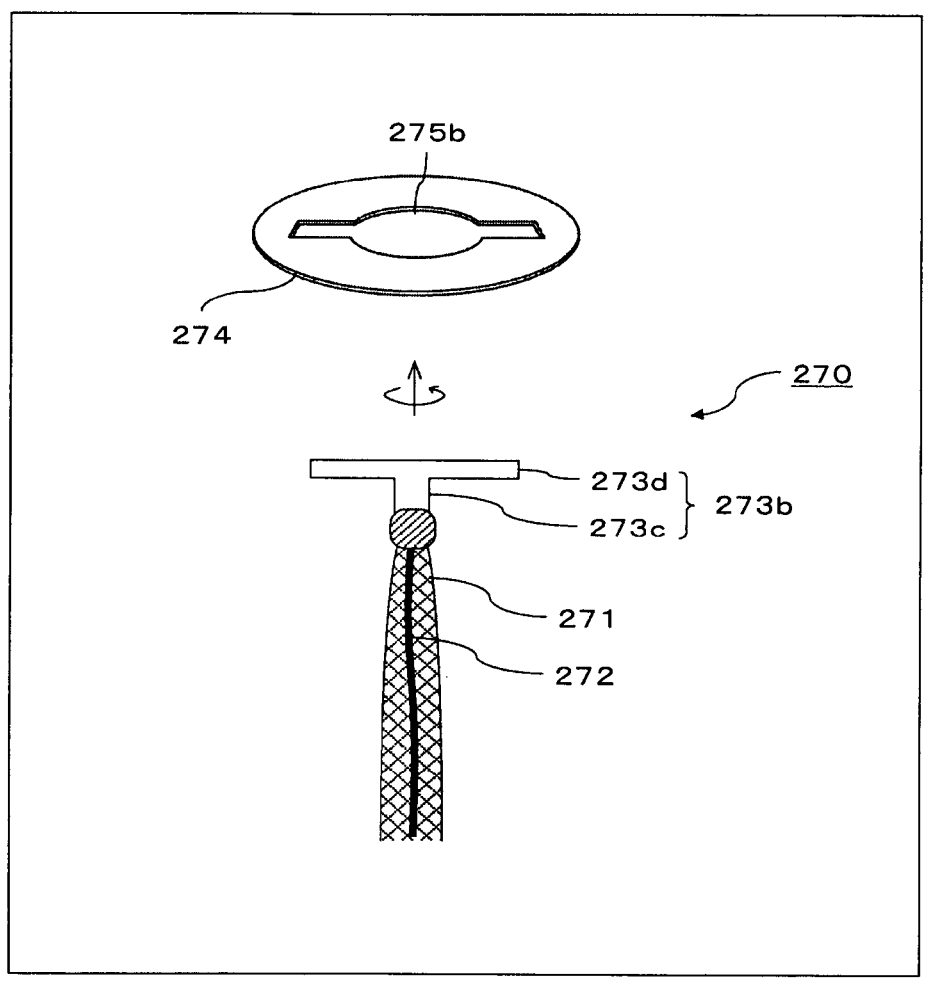
FIG. 9 is an outline view for explaining the fitting structure of the plasma discharge electrode in the vertical type substrate processing furnace of the substrate processing apparatus according to other example of the present invention.
Figure 10:
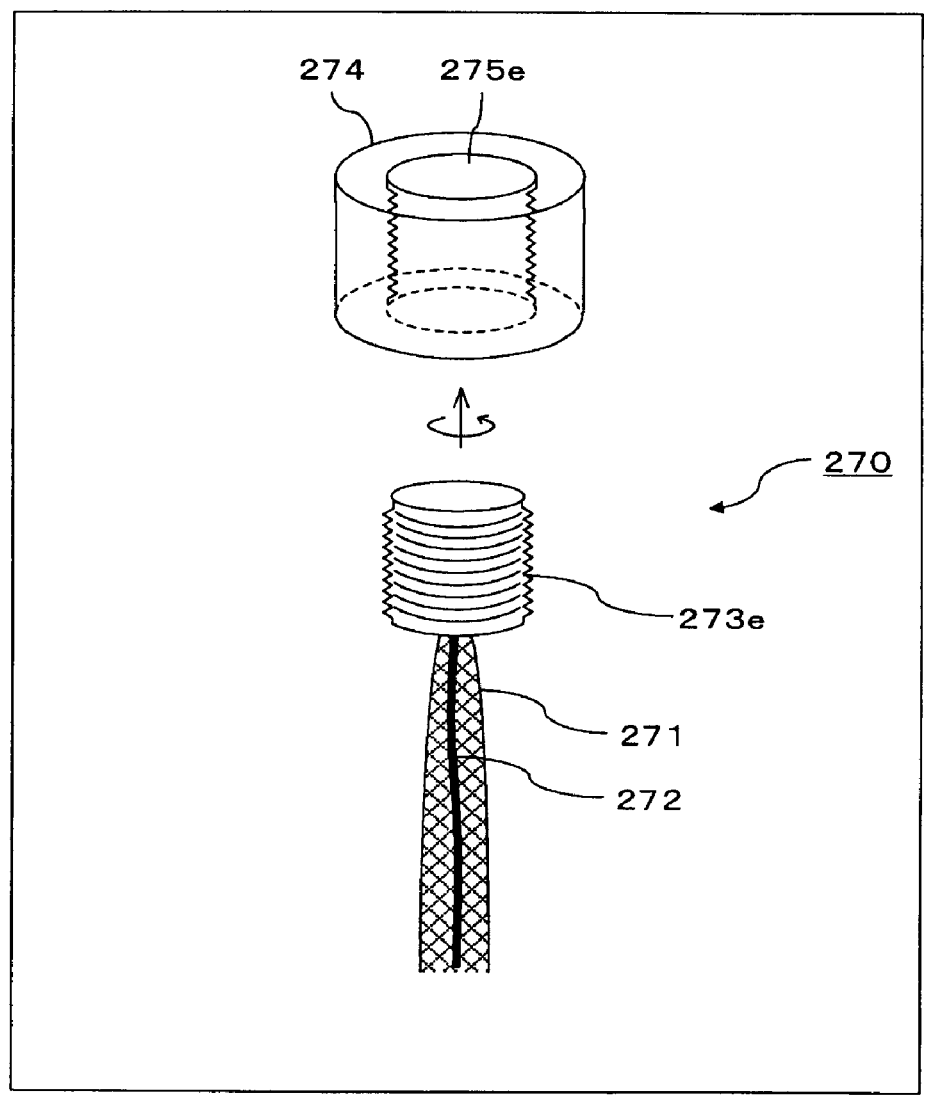
FIG. 10 is an outline view for explaining the fitting structure of the plasma discharge electrode in the vertical type substrate processing furnace of the substrate processing apparatus according to other example of the present invention.
Figure 11:
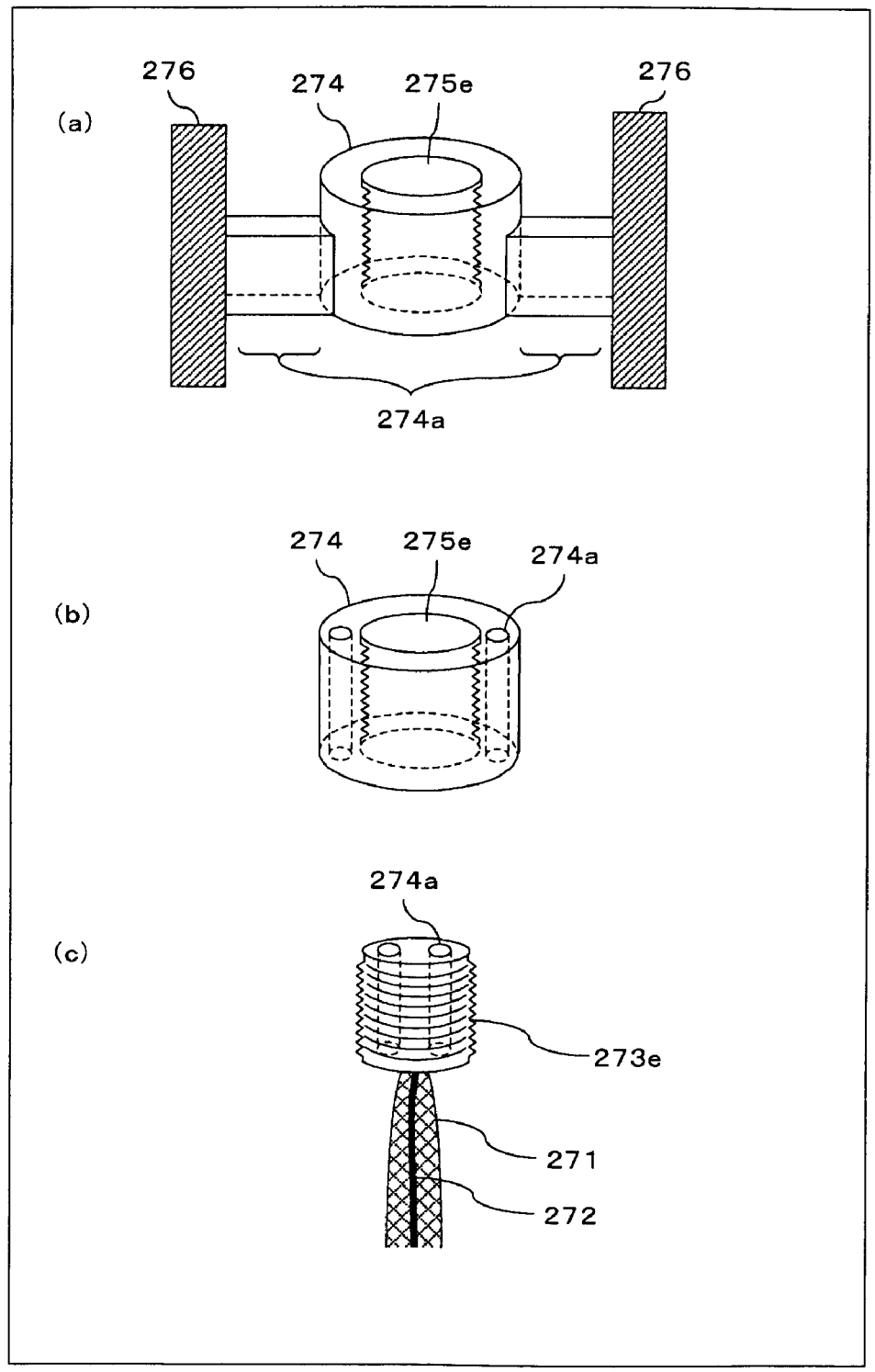
FIG. 11 is an outline view showing the structure of a space for purging an inside of the electrode protective tube by inert gas, (a) is a general outline view forming the space outside of a fitting member, (b) is a general outlined view forming the space inside of the fitting member, (c) is a general outline view forming the space in a convex screw member.

105 Cassette shelf
107 Preliminary cassette shelf
110 Cassette
111 Casing
114 Cassette stage
115 Boat elevator
118 Cassette carrier
118a Cassette elevator
118b Cassette transport mechanism
123 Transfer shelf
125 Wafer transport mechanism
125a Wafer transfer device
125b Wafer transfer device elevator
125c Tweezer
128 Arm
134a Clean unit
134b Clean unit
147 Furnace throat shutter
200 Wafer
201 Processing chamber
202 Processing furnace
203 Reaction tube
207 Heater
209 Lower side reaction tube
217 Boat
219 Seal cap
224 Plasma
231 Gas exhaust tube
232 Gas supply tube
237 Buffer chamber
248 Small hole
270 Plasma discharge electrode
271 Net-like electrode
272 Core
273 Banana-shaped spring terminal (first fitting member)
273a Bended spring terminal (first fitting member)
273b Block member (first fitting member)
273e Convex screw member 273 member (first fitting member)
274 Second fitting member
275 Hole (through hole)
275b Hole (through hole)
275e Screw hole (through hole)
276 Electrode protective tube
277 Electrode end part
282 Matching unit
283 Oscillator

The invention claimed is:

1. A substrate processing apparatus, comprising:
a processing chamber that houses a plurality of substrates, with a spacing provided from each other, in a state of being stacked;
a gas supply unit that supplies a desired gas into the processing chamber;
an exhaust unit that exhausts an atmosphere in the processing chamber;
at least two electrodes disposed to extend in a stacking direction of said substrates and having flexibility;
a protective tube that contains each electrode;
a first fitting member fixed to a top end of each electrode; and
a second fitting member disposed at an upper end part of each protective tube,
the electrode being contained in the protective tube, with said first fitting member and said second fitting member connected to each other.

2. The substrate processing apparatus according to claim 1, wherein the electrode has a net-like electrode and a core incorporated into the net-like electrode.

3. The substrate processing apparatus according to claim 1, wherein said protective tube is disposed inside of a reaction tube that forms said processing chamber.

4. The substrate processing apparatus according to claim 1, wherein said protective tube having said second fitting member has the upper end part closed and the other end part opened, and said electrode is inserted into the protective tube from the other end part of said protective tube toward the upper end part of said protective tube, with said first fitting member set as a head.

5. The substrate processing apparatus according to claim 1, wherein said second fitting member disposed in the upper end part of said protective tube is disposed at a further upper position from an uppermost substrate of said plurality of substrates contained in said processing chamber.

6. The substrate processing apparatus according to claim 1, wherein said second fitting member has a through hole and said first fitting member has an elastic part that penetrates said through hole, and a width of said elastic part is expanded in a diameter direction of said through hole after penetrating said through hole, and said first fitting member and said second fitting member are connected to each other.

7. The substrate processing apparatus according to claim 6, wherein said elastic part of said first fitting member is a spring terminal.

8. A processing chamber, comprising:
a processing chamber that houses a plurality of substrates, with a space provided from each other in a state of being stacked;
a gas supply unit that supplies a desired gas into said processing chamber;
an exhaust unit that exhausts an atmosphere in said processing chamber;
at least two electrodes disposed to extend in a stacking direction of said substrates, having a net-like electrode and a core incorporated into said net-like electrode and having flexibility;
a protective tube disposed inside of a reaction tube that forms said processing chamber, with a top end part closed and the other end part opened, for containing each electrode;
a first fitting member fixed to the top end of each electrode;
a second fitting member disposed in an upper end part of each protective tube and disposed at a further upper position from an uppermost substrate of the plurality of substrates housed in said processing chamber,
said electrode being inserted into the protective tube from the other end part of said protective tube toward the top end part of said protective tube, with said first fitting member set as a head, and
said electrode being contained in said protective tube, with said first fitting member and said second fitting member connected to each other.

* * * * *